United States Patent [19]

Yoon

[11] Patent Number: 5,721,147
[45] Date of Patent: Feb. 24, 1998

[54] METHODS OF FORMING BIPOLAR JUNCTION TRANSISTORS

[75] Inventor: Kwang-Joon Yoon, Kyungki-do, Rep. of Korea

[73] Assignee: Samsung Electronics Co., Ltd., Suwon, Rep. of Korea

[21] Appl. No.: 712,289

[22] Filed: Sep. 11, 1996

[30] Foreign Application Priority Data

Sep. 29, 1995 [KR] Rep. of Korea ............... 95-32835

[51] Int. Cl.$^6$ ............................................. H01L 21/265
[52] U.S. Cl. ................ 437/31; 437/162; 437/186; 148/DIG. 10; 148/DIG. 11
[58] Field of Search .................. 437/31, 162, 186; 148/DIG. 10, 11

[56] References Cited

U.S. PATENT DOCUMENTS

| | | | |
|---|---|---|---|
| 4,101,350 | 7/1978 | Possley et al. | 148/175 |
| 4,504,332 | 3/1985 | Shinada | 148/187 |
| 4,531,282 | 7/1985 | Sakai et al. | 29/578 |
| 4,641,416 | 2/1987 | Iranmanesh et al. | 29/576 W |
| 4,746,629 | 5/1988 | Hanagasaki | 437/31 |
| 4,829,016 | 5/1989 | Neudeck | 437/31 |
| 4,830,972 | 5/1989 | Hamasaki | 437/31 |
| 4,849,371 | 7/1989 | Hansen et al. | 437/82 |
| 4,851,362 | 7/1989 | Suzuki | 437/31 |
| 4,900,689 | 2/1990 | Bajor et al. | 437/31 |
| 4,927,774 | 5/1990 | Welbourn et al. | 437/31 |
| 4,974,045 | 11/1990 | Okita | 357/34 |
| 4,988,632 | 1/1991 | Pfiester | 437/31 |
| 4,997,775 | 3/1991 | Cook et al. | 437/31 |
| 5,017,990 | 5/1991 | Chen et al. | 357/34 |
| 5,026,654 | 6/1991 | Tanba et al. | 437/31 |
| 5,118,634 | 6/1992 | Neudeck et al. | 437/31 |
| 5,177,582 | 1/1993 | Meister et al. | 257/588 |
| 5,382,828 | 1/1995 | Neudeck et al. | 257/586 |
| 5,434,092 | 7/1995 | Neudeck et al. | 437/34 |

FOREIGN PATENT DOCUMENTS

| | | | |
|---|---|---|---|
| 56-43754 | 4/1981 | Japan . | |
| 56-83063 | 7/1981 | Japan . | |
| 63-215068 | 9/1988 | Japan . | |
| 025428 | 1/1990 | Japan | 437/31 |
| 2-1934 | 1/1990 | Japan . | |
| 2-1936 | 1/1990 | Japan . | |
| 2-58335 | 2/1990 | Japan . | |
| 2-151037 | 6/1990 | Japan . | |
| 405182980 | 7/1993 | Japan | 437/31 |

OTHER PUBLICATIONS

C. Subramanian et al., A Full–Wafer SOI Process For 3 Dimensional Integration, 9th Biennial University Government Industry Microelectronics Symposium, Melbourne, Fl, pp. 195–198, Jun. 12–14, 1991.

(List continued on next page.)

Primary Examiner—John Niebling
Assistant Examiner—Long Pham
Attorney, Agent, or Firm—Myers, Bigel, Sibley & Sajovec, L.L.P.

[57] ABSTRACT

Methods of forming bipolar junction transistors include the steps of forming a first insulating layer on a face of a semiconductor substrate containing a collector region of first conductivity type therein and then forming an opening in the first insulating layer to expose the collector region at the face. An extrinsic base region contact layer of second conductivity type is then formed on the first insulating layer and in the opening and then an extrinsic base region of second conductivity type is formed in the collector region, at the opening in the first insulating layer. Next, a second insulating layer is formed on the extrinsic base region contact layer and first insulating layer, using the first insulating layer as a mask to prevent contact between the second insulating layer and the collector region at the face. To complete the transistor, an intrinsic base region of second conductivity type is then formed in the collector region and then an emitter region of first conductivity type is formed in the intrinsic base region.

25 Claims, 4 Drawing Sheets

OTHER PUBLICATIONS

J. Glenn et al., High-Speed Fully Self-Aligned Single-Crystal Contacted Silicon Bipolar Transistor, Electronics Letters, vol. 26, No. 20, Sep. 27, 1990, pp. 1677–1678.

S. Konaka et al., A 20-ps Si Bipolar IC Using Advanced Super Self-Aligned Process Technology With Collector Ion Implantation, IEEE Transactions on Electron Devices, vol. ED-36, No. 7, pp. 1370–1375, Jul. 1989.

Y. Yamamoto et al., SDX: A Novel Self-Aligned Technique And Its Application To High-Speed Bipolar LSI's, IEEE Transactions on Electronc Devices, vol. ED-35, No. 10, pp. 1601–1608, Oct. 1988.

K. Washio et al., Fabrication Process and Device Characteristics Of Sidewall Base Contact Structure Transistor Using Two-Step Oxidation Of Sidewall Surface, IEEE Transactions On Electron Devices, vol. ED-35, No. 10, pp. 1596–1599, Oct. 1988.

S. Konaka et al., A 30-ps Si Bipolar IC Using Super Self-Aligned Process Technology, IEEE Transactions On Electron Devices, vol. ED-33, No. 4, pp. 526–531, Apr. 1986.

T. Sakai et al., High Speed Bipolar ICs Using Super Self-Aligned Process Technology, Japanese Journal of Applied Physics, vol. 20, Supplement 20-1, 1981, pp. 155–159.

T. Chen et al., A Submicrometer High-Performance Bipolar Technology, IEEE Electron Device Letters, vol. 10, No. 8, Aug. 1989, pp. 364–366.

D. Tang et al., A Symmetrical Bipolar Structure, 1980 IEDM, Digest of Technical Papers, pp. 58–60.

METHODS OF FORMING BIPOLAR JUNCTION TRANSISTORS

FIELD OF THE INVENTION

The present invention relates to semiconductor devices and methods of fabrication, and more particularly to bipolar junction transistors and methods of forming bipolar junction transistors.

BACKGROUND OF THE INVENTION

As state-of-the-art computer systems and circuits evolve, there is a continuing need for higher performance bipolar junction transistors capable of operating at higher switching speeds, with increasing degrees of device integration, and with a low rate of failure. There is also a continuing need to shrink or scale down device size to obtain improved device performance. In order to obtain further advances in device scaling, improved lithographic techniques and equipment must be developed. Unfortunately, the lithographic patterning tolerances of state-of-the-art equipment is rapidly reaching its limits. The range of future device geometries and contact line widths require extremely small dimensions. Thus, lithographic errors within the normal tolerance range can impede efforts to further shrink device size. Accordingly, it would be advantageous to develop processes and device geometries less dependent on photolithographic accuracy.

Attempts to reduce dependency on photolithographic accuracy typically include the steps of self-aligning various active regions of the bipolar junction transistor to each other. In a "self-aligned" process, at least one device region is used as an alignment guide for forming a subsequent region(s). Accordingly, self-aligned fabrication processes are less dependent upon precise photolithographic alignment than similarly directed non self-aligned processes. Faster switching speeds can also be obtained, in part, by reducing the lateral and vertical size and parasitic components of individual transistors and increasing the degree of integration. Typical parasitics include base resistance, $r_b$, base-collector capacitance, $C_{bc}$, collector resistance, $r_c$, and collector-substrate capacitance, $C_{cs}$. As these parasitic components are reduced, device performance improves because faster device operation and lower power consumption is possible.

FIGS. 1-2 illustrates a schematic cross-sectional view of a prior art bipolar junction transistor formed using self-alignment techniques. In particular, the method of forming the transistor of FIGS. 1-2 includes the steps of defining an inactive portion of a substrate 10 by forming a field oxide 13 thereon and defining an active portion of the substrate 10 in an opening in the field oxide 1:3. An extrinsic collector/buried layer 11 is also formed in the substrate 10. A base contact layer 14 comprising doped polycrystalline silicon is then formed and patterned using a dry etching step which exposes the face of the substrate. The patterned base contact layer 14 is then oxidized to form an insulating layer 16 thereon while simultaneously diffusing dopants from the base contact layer 14 into the substrate 10 to form an extrinsic base region 17. The insulating layer 16 is then etched to expose the face and then sidewall oxide spacers extending along the exposed face are formed by oxidizing exposed sidewalls of the base contact layer 14. An intrinsic base region is then formed and followed by the step of forming a patterned polycrystalline silicon emitter layer 15 on the exposed face. The emitter layer 15 is then used as a source of dopants to form a diffused emitter region 18 in the intrinsic base region. Unfortunately, the process of forming the bipolar junction transistor of FIGS. 1-2 requires a step of patterning a base contact layer 14 using a dry etching technique, such as reactive ion etching (RIE), to expose the face of the semiconductor substrate 10 where the intrinsic base and emitter regions are to be formed. However, dry etching of the face of a semiconductor substrate can damage the substrate by, among other things, forming lattice defects therein. In addition, the step of forming the sidewall oxide spacers can cause lattice defects in the substrate 10 because of the volume expansion which occurs when polycrystalline silicon is thermally oxidized along the face thereof. This parasitic consequence of forming sidewall oxide spacers along the face of the substrate is more fully described in U.S. Pat. No. 4,830,972 to Hamasaki, entitled Method of Manufacturing Bipolar Transistor. Finally, as illustrated best by FIG. 2, accurate control over the size of the contact window ("$W_c$") to the extrinsic base region can be difficult because the length of the bird's beak oxide extension is difficult to control.

Thus, notwithstanding the above described method of forming bipolar junction transistors, there still continues to be a need for improved methods of forming bipolar junction transistors which do not result in the formation of active regions having lattice defects therein or contact regions having large lateral dimensions.

SUMMARY OF THE INVENTION

It is therefore an object of the present invention to provide improved methods of forming bipolar junction transistors.

It is another object of the present invention to provide methods of forming bipolar junction transistors wherein the width/area of the intrinsic base regions therein can be accurately controlled.

It is also an object of the present invention to provide methods of forming bipolar junction transistors wherein the width/area of the extrinsic base regions therein can be accurately controlled.

It is a further object of the present invention to provide methods of forming bipolar junction transistors wherein the width/area of the emitter regions therein can be accurately controlled.

It is still a further object of the present invention to provide methods of forming bipolar junction transistors having self-aligned base and emitter regions.

It is also an object of the present invention to provide methods of forming bipolar junction transistors which limit the exposure of active regions therein to dry etchants.

It is also an object of the present invention to provide methods of forming bipolar junction transistors which limit the exposure of active regions therein to lattice defects caused by volume expansion of oxidized polycrystalline silicon.

These and other objects, features and advantages of the present invention are provided by methods of forming bipolar junction transistors (BJTs) which include the steps of forming a first insulating layer on a face of a semiconductor substrate containing a region of first conductivity type therein extending to the face, and then forming an electrically conductive layer thereon. The first insulating layer may be formed by thermally oxidizing a face of the substrate and the electrically conductive layer may comprise deposited polycrystalline silicon. An oxide cap is then formed on a portion of the electrically conductive layer, preferably by depositing a layer of silicon dioxide ($SiO_2$) using chemical vapor deposition techniques and then patterning the deposited layer to form the oxide cap. A nitride spacer is then formed on an exposed sidewall of the oxide cap. The nitride spacer may be formed by depositing a layer of silicon nitride ($Si_3N_4$) on an upper surface of the electrically conductive layer and upper surface of the oxide cap and then anisotropically etching the deposited nitride layer to define the spacer on the sidewalls of the oxide cap. After the layer of silicon nitride has been etched to form the nitride spacer, an upper surface of the electrically conductive layer is preferably thermally oxidized to form a layer of silicon dioxide thereon. The duration of the thermal oxidation step is kept relatively short so that the resulting layer of silicon dioxide is substantially thinner than the oxide cap.

Dopants of second conductivity type (e.g., P-type) are then selectively implanted through the thermal oxide layer and into the electrically conductive layer to increase the conductivity thereof. The nitride spacer is then removed to expose a portion of the upper surface of the electrically conductive layer. The exposed portion of the upper surface is then anisotropically etched using the oxide cap and thermal oxide layer as a mask, to define an extrinsic base region contact layer of second conductivity type on an underlying first portion of the first insulating layer and also define an undoped sacrificial portion on an underlying second portion of the first insulating layer. An opening of predetermined width is also formed in the extrinsic base region contact layer during the anisotropic etching step. After formation of the opening, the oxide cap and thermal oxide layer are selectively removed. The portion of the first insulating layer exposed by the opening in the extrinsic base region contact layer is also removed to thereby define an opening which exposes the region of first conductivity type in the substrate.

The undoped sacrificial portion of the electrically conductive layer is then selectively removed using a conventional technique, to expose the second portion of the first insulating layer. Then, an electrically conductive polycrystalline silicon sidewall spacer of second conductivity type is formed on an exposed sidewall of the extrinsic base region contact layer of second conductivity type and on the exposed portion of the region of first conductivity type in the opening in the first insulating layer. This step is preferably performed by depositing a polycrystalline silicon layer and then anisotropically dry etching the deposited polycrystalline silicon layer, using the second portion of the first insulating layer as an etching mask to prevent the region of first conductivity type at the face of the substrate from being damaged by the dry etching step. The polycrystalline silicon layer may be in-situ doped with second conductivity type dopants during deposition thereof or an implantation step may be performed after the sidewall spacer has been patterned.

A second insulating layer is then formed on the extrinsic base region contact layer of second conductivity type, the sidewall spacer of second conductivity type and on the second portion of the first insulating layer. This second insulating layer forming step is preferably performed simultaneously with a step of diffusing dopants of second conductivity type from the sidewall spacer into the region of first conductivity type, through the opening in the first insulating layer. Here, the width of the opening in the first insulating layer can be made small to thereby reduce the width of the extrinsic base region, the contact capacitance and increase the speed of the bipolar junction transistor. The use of the second portion of the first insulating layer to separate the second insulating layer from the face of the substrate during thermal oxidation of the sidewall spacer also inhibits the occurrence of lattice defects which would otherwise be generated at the face during the volume expansion of the oxidized polycrystalline silicon along the face.

A silicon nitride spacer of predetermined thickness is then preferably formed on the second insulating layer and second portion of the first insulating layer to define a window for forming an intrinsic base region. In particular, the intrinsic base region is formed by implanting dopants of second conductivity type through the second portion of the first insulating layer, using the silicon nitride spacer as an implant mask. The silicon nitride spacer is preferably formed by depositing a layer of silicon nitride and then anisotropically dry etching the deposited layer of silicon nitride using the second portion of the first insulating layer as a mask to protect the face of the substrate. Preferably, the lateral width of the intrinsic base region can be carefully controlled by adjusting the thickness of the silicon nitride spacer. Like the width of the extrinsic base region, the width/area of the intrinsic base region significantly influences the I-V characteristics of the bipolar junction transistor.

The exposed portion of the first insulating layer, which is defined by the silicon nitride spacer, is then removed by a selective wet etching step to expose the intrinsic base region at the face of the substrate and define a self-aligned emitter contact hole. A dry etching step is preferably not performed to define the emitter contact hole, because such a step would result in surface damage at the face of the intrinsic base region by creating lattice defects therein. Then, a layer of polycrystalline silicon is deposited, patterned and implanted (or in-situ doped) with first conductivity type dopants to form an emitter contact. A thermal treatment step is then performed to cause diffusion of first conductivity type dopants from the emitter contact into the intrinsic base region, to form a self-aligned emitter region of first conductivity type therein.

DESCRIPTION OF PREFERRED EMBODIMENTS

Figure 1:
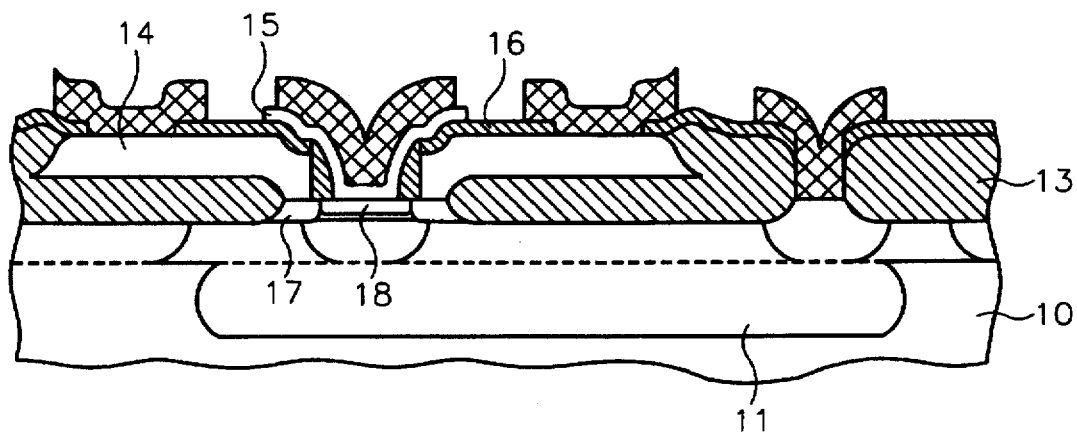
FIG. 1 illustrates a schematic cross-sectional view of a bipolar junction transistor according to the prior art.
Figure 2:
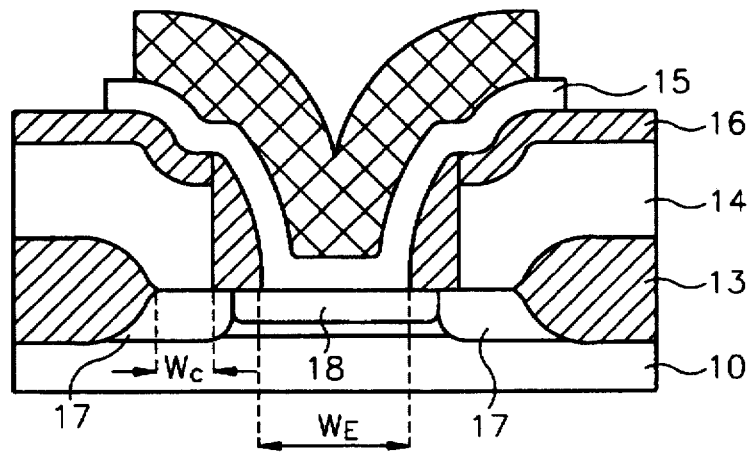
FIG. 2 is an enlarged schematic cross-sectional view of the base and emitter regions of the bipolar junction transistor of FIG. 1.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as P or N-type and each embodiment described and illustrated herein includes its complementary embodiment as well.

Figure 3A:
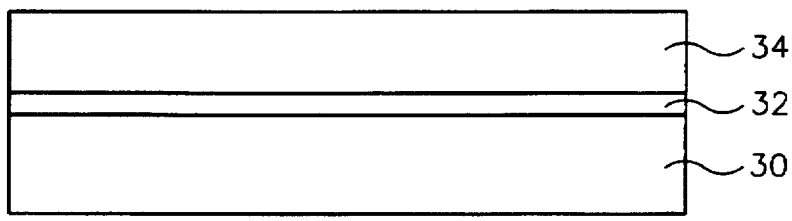
FIGS. 3A–3J illustrate schematic cross-sectional views of intermediate structures illustrating a preferred method of forming a bipolar junction transistor according to the present invention.

Referring now to FIGS. 3A–3J, a preferred method of forming a bipolar junction transistor according to the present invention will be described. In particular, FIG. 3A illustrates the steps of forming a first insulating layer 32 on a face of a semiconductor substrate 30 and then forming an electrically conductive layer 34 thereon. The first insulating layer 32 may be formed by thermally oxidizing a face of the substrate 30 and the electrically conductive layer may comprise deposited polycrystalline silicon; for example. The illustrated portion of the semiconductor substrate 30 comprises a region of first conductivity type (e.g., N-type). This region of first conductivity type may serve as an intrinsic collector region of the bipolar junction transistor, as described more fully hereinbelow. As will be understood by those skilled in the art, a highly conductive buried/extrinsic collector region of first conductivity type (not shown) may also be provided in the substrate 30, to electrically connect the intrinsic collector region to a remote collector contact (not shown).

Figure 3B:
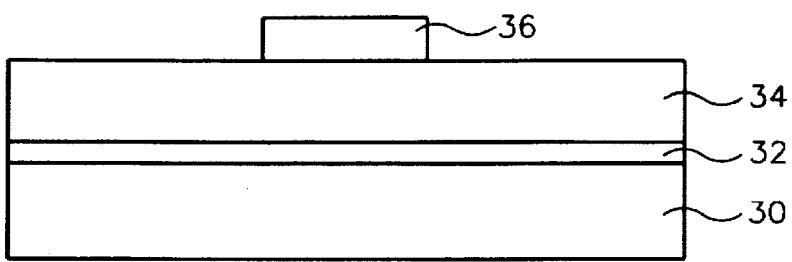
Figure 3C:
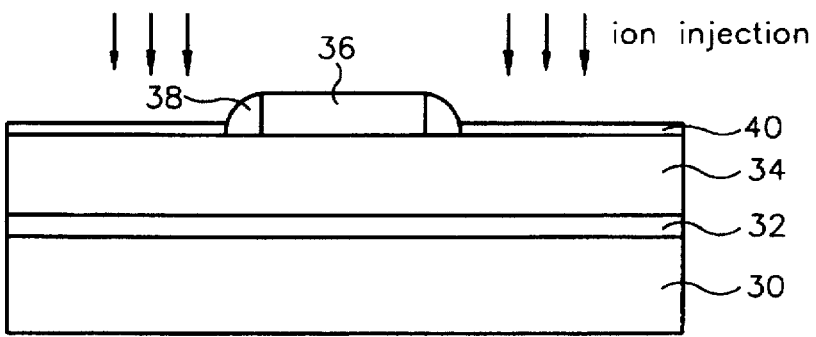

Referring now to FIG. 3B, an oxide cap 36 is formed on a portion of the electrically conductive layer 34 preferably by depositing a layer of silicon dioxide ($SiO_2$) using chemical vapor deposition techniques and then patterning the deposited layer to form the oxide cap 36, using a photoresist layer (not shown) as a mask. As illustrated by FIG. 3C, a nitride spacer(s) 38 is then formed on an exposed sidewall of the oxide cap 36 and adjacent portion of the electrically conductive layer 34. The nitride spacer(s) 38 may be formed by depositing a layer of silicon nitride ($Si_3N_4$) on an upper surface of the electrically conductive layer 34 and oxide cap 36 and then anisotropically etching the deposited nitride layer to define the spacer(s) 38 on the sidewalls of the oxide cap 36. After the layer of silicon nitride has been etched to form the nitride spacer(s) 38, an upper surface of the electrically conductive layer 34 is preferably thermally oxidized to form a layer 40 of silicon dioxide thereon. The duration of the thermal oxidation step is kept relatively short so that the resulting layer 40 of silicon dioxide is substantially thinner than the oxide cap 36. Referring still to FIG. 3C, dopants of second conductivity type (e.g., P-type) are then selectively implanted through the thermal oxide layer 40 and into the electrically conductive layer 34 to increase the conductivity thereof. However, the energy level of the implanted dopants is preferably maintained at a relatively low level to implant only through the thermal oxide layer 40, but not the thicker oxide cap 36. Thus, the portion of the electrically conductive layer 34 underneath the oxide cap 36 preferably does not receive the implanted second conductivity type dopants.

Figure 3D:
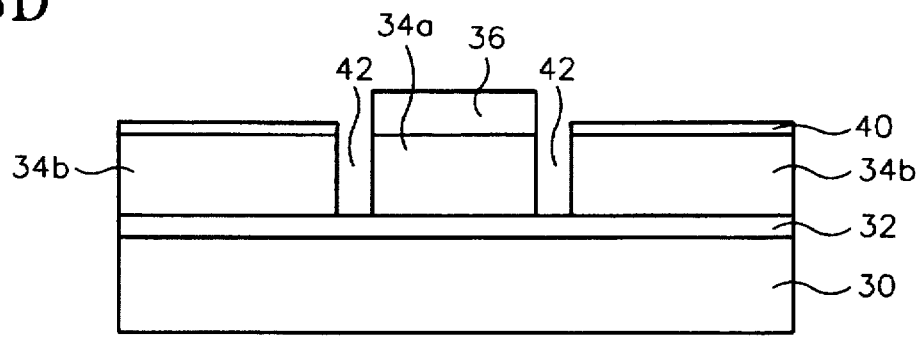
Figure 3E:
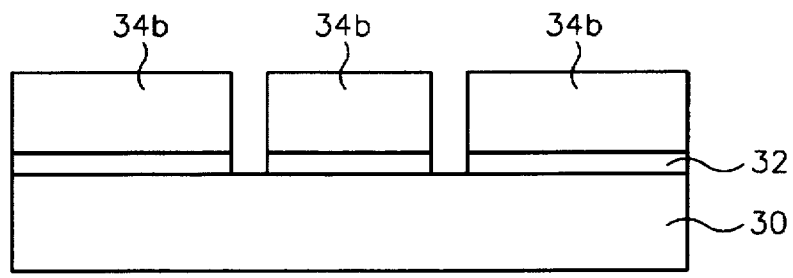

Referring now to FIG. 3D, the nitride spacer(s) 38 is then removed to expose a portion(s) of the upper surface of the electrically conductive layer 34. The exposed portion(s) of the upper surface is then anisotropically etched using the oxide cap 36 and thermal oxide layer 40 as a mask, to define an extrinsic base region contact layer 34b of second conductivity type on an underlying first portion of the first insulating layer 32 and also define an undoped sacrificial portion 34a on an underlying second portion of the first insulating layer 32. As illustrated, an opening(s) 42 of predetermined width (when viewed in transverse cross-section) is formed during the anisotropic etching step. As will be understood by those skilled in the art, this predetermined width is a function of the width of the nitride spacer(s) 38 which is a function of the thickness of the deposited silicon nitride layer (not shown) and oxide cap 36. Thus, the width of the opening 42 may be carefully controlled. As illustrated by FIG. 3E, after formation of the opening(s) 42, the oxide cap 36 and thermal oxide layer 40 are selectively removed along with the portion(s) of the first insulating layer 32 which is exposed by the opening(s) 42, using an etchant. The removal of the portion of the first insulating layer results in a patterned first insulating layer having first and second portions.

Figure 3F:
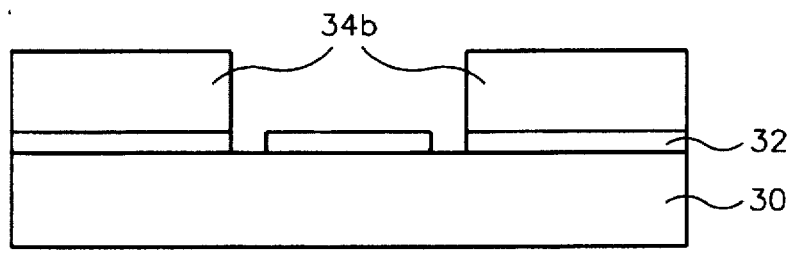
Figure 3G:
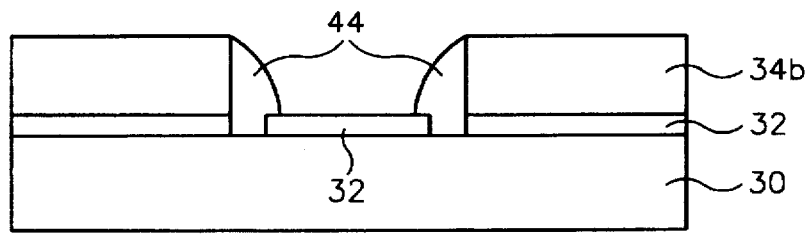

Referring now to FIG. 3F, the undoped sacrificial portion 34a of the electrically conductive layer is then selectively removed using a conventional technique, to expose the second portion of the patterned first insulating layer 32. Then, as illustrated best by FIG. 3G, an electrically conductive polycrystalline silicon sidewall spacer(s) 44 of second conductivity type is formed on an exposed sidewall of the extrinsic base region contact layer 34b of second conductivity type and on the exposed portion of the region of first conductivity type in the opening in the patterned first insulating layer 32. This step is preferably performed by depositing a polycrystalline silicon layer (not shown) and then anisotropically dry etching the deposited polycrystalline silicon layer, using the second portion of the patterned first insulating layer 32 as an etching mask to prevent the region of first conductivity type at the face of the substrate 30 from being damaged by the dry etching step. A suitable dry-etching technique includes reactive ion etching (RIE). The polycrystalline silicon layer may be in-situ doped with second conductivity type dopants during deposition thereof or an implantation step may be performed after the sidewall spacer(s) 44 has been patterned.

Figure 3H:
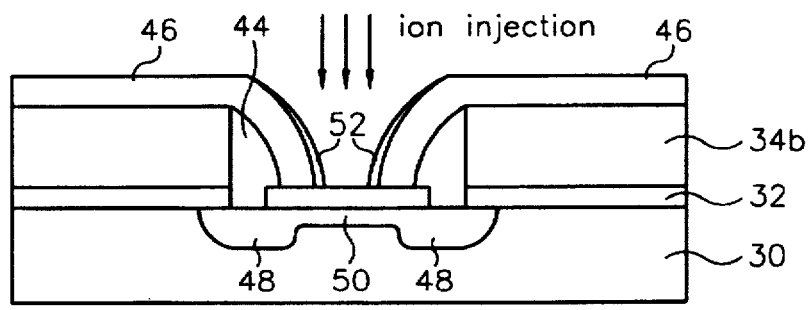

Referring now to FIG. 3H, a second insulating layer 46 is then formed on the extrinsic base region contact layer 34b of second conductivity type, the sidewall spacer(s) 44 of second conductivity type and on the second portion of the patterned first insulating layer 32. This second insulating layer 46 forming step is preferably performed simultaneously with the step of diffusing dopants of second conductivity type from the sidewall spacer(s) 44 into the region of first conductivity type, through the opening in the patterned first insulating layer 32. In particular, by forming the second insulating layer 46 using conventional thermal oxidation techniques, for example, sufficient thermal energy can be transferred to the sidewall spacer(s) 44 to cause diffusion of the dopants therein into the region of first conductivity type at the face of the substrate. Thus, an extrinsic base region 48 of second conductivity type can be formed in the region of first conductivity type and the extrinsic base region contact layer 34b and sidewall spacer(s) 44 can be used to make electrical contact thereto via a remote base contact (not shown). As will be understood by those skilled in the art, the width of the opening in the patterned first insulating layer 32 can be made small to thereby reduce the width of the extrinsic base region 48, the contact capacitance and increase the speed of the bipolar junction transistor. Here, the use of the second portion of the patterned first insulating layer 32 to separate the second insulating layer 46 from the face of the substrate 30 during thermal oxidation of the sidewall spacer(s) 44, inhibits the occurrence of lattice defects which would otherwise be generated at the face during the volume expansion of the oxidized polycrystalline silicon along the face.

Referring still to FIG. 3H, a silicon nitride spacer(s) 52 of predetermined thickness is then preferably patterned on the second insulating layer 46 and second portion of the patterned first insulating layer 32 to define a window for forming an intrinsic base region 50. In particular, the intrinsic base region 50 is formed by implanting dopants of second conductivity type through the second portion of the patterned first insulating layer 32, using the silicon nitride spacer(s) 52 as an implant mask. The silicon nitride spacer(s) 52 is preferably formed by depositing a layer of silicon nitride (not shown) and then anisotropically dry etching the deposited layer of silicon nitride using the second portion of the patterned first insulating layer 32 as a mask to protect the face of the substrate 30. Preferably, the lateral width of the intrinsic base region 50 can be carefully controlled by adjusting the thickness of the width nitride spacer(s) 52. Like the width of the extrinsic base region 48, the width/area of the intrinsic base region 50 significantly influences the I-V characteristics of the bipolar junction transistor.

Figure 3I:
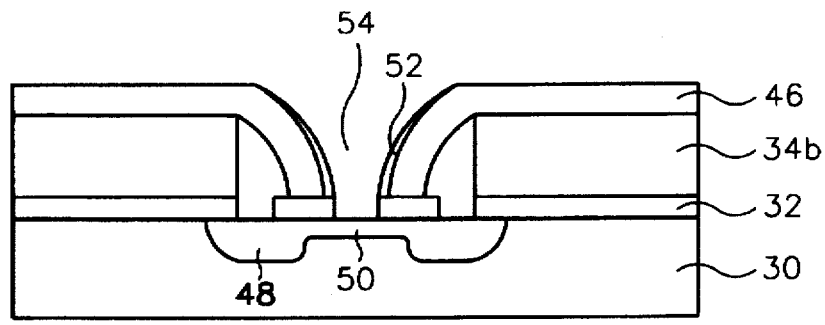
Figure 3J:
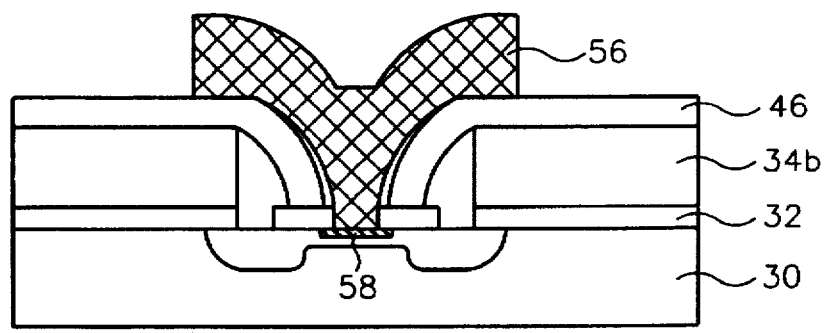
Figure 4:
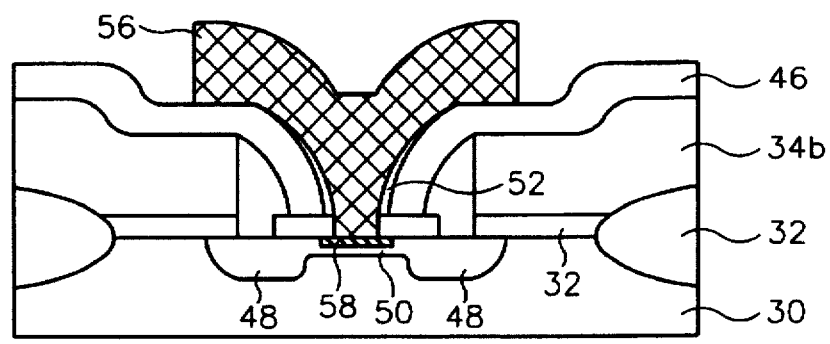
FIG. 4 illustrates a schematic cross-sectional view of a bipolar junction transistor formed in accordance with the preferred method illustrated at FIGS. 3A–3J.

As illustrated best by FIG. 3I, the exposed portion of the patterned first insulating layer 32, which is defined by the silicon nitride spacer(s) 52, is then removed by a selective wet etching step to expose the intrinsic base region 50 at the face of the substrate 30 and define a self-aligned emitter contact hole 54. A dry etching step is preferably not performed to define the emitter contact hole, because such a step would result in surface damage at the face of the intrinsic base region 50. Then, a layer of polycrystalline silicon is deposited, patterned and implanted (or in-situ doped) with first conductivity type dopants to form an emitter contact 56, as illustrated by FIG. 3J. A thermal treatment step is then performed to cause diffusion of first conductivity type dopants from the emitter contact 56 into the intrinsic base region 50, to form an emitter region 58 of first conductivity type therein. Referring now to FIG. 4, a completed bipolar junction transistor is illustrated. The transistor is spaced from adjacent devices in the substrate by a field oxide isolation region 31. As will be understood by those skilled in the art, a collector contact (not shown) can be made to a buried/extrinsic collector region by forming a collector contact window in the field oxide isolation region 31. A base contact (not shown) can also be made to the extrinsic base region contact layer 34b by forming a base contact window in the second insulating layer 46.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a bipolar junction transistor, comprising the steps of:

forming a first insulating layer on a face of a semiconductor substrate containing a region of a first conductivity type therein extending to the face;

forming an electrically conductive layer on the first insulating layer, opposite the face;

patterning the electrically conductive layer to define an extrinsic base region contact layer having an exposed sidewall, on a first portion of the first insulating layer;

patterning the first insulating layer to define a second portion thereof and a first opening therein which exposes the region of first conductivity type at the face;

forming an electrically conductive sidewall spacer of a second conductivity type on the exposed sidewall of the extrinsic base region contact layer and on the exposed region of first conductivity type at the first opening in the patterned first insulating layer;

forming a second insulating layer on the extrinsic base region contact layer and sidewall spacer of second conductivity type while simultaneously diffusing dopants of second conductivity type from the sidewall spacer into the exposed region of first conductivity type to define an extrinsic base region of second conductivity type therein;

forming an intrinsic base region of second conductivity type in the region of first conductivity type to define a base-collector P-N junction;

patterning the second portion of the first insulating layer to define a second opening therein which exposes a portion of the intrinsic base region at the face; and forming an emitter region of first conductivity type in the exposed portion of the intrinsic base region to define an emitter-base P-N junction.

2. The method of claim 1, wherein said sidewall spacer forming step comprises forming a sidewall spacer of second conductivity type on the exposed sidewall of the extrinsic base region contact layer, the exposed region of first conductivity type at the first opening in the patterned first insulating layer and the second portion of the patterned first insulating layer.

3. The method of claim 2, wherein said second insulating layer forming step comprises forming a second insulating layer on the extrinsic base region contact layer, the sidewall spacer of second conductivity type and the second portion of the patterned first insulating layer.

4. The method of claim 1, wherein said sidewall spacer forming step comprises depositing a polycrystalline silicon layer on the exposed sidewall of the extrinsic base region contact layer and on the exposed region of first conductivity type at the first opening in the patterned first insulating layer; and then anisotropically etching the deposited polycrystalline silicon layer using the second portion of the insulating layer as an etching mask to protect the region of first conductivity type at the face of the substrate.

5. The method of claim 4, wherein said step of anisotropically etching the deposited polycrystalline silicon layer comprises dry etching the deposited polycrystalline silicon layer.

6. The method of claim 4, wherein said second insulating layer forming step comprises oxidizing the extrinsic base region contact layer and sidewall spacer simultaneously.

7. The method of claim 6, wherein said intrinsic base region forming step comprises implanting dopants of second conductivity type through the second portion of the first insulating layer and into the region of first conductivity type at the face of the substrate.

8. The method of claim 7, wherein said intrinsic base region forming step is preceded by the step of forming a nitride spacer on the second portion of the first insulating layer; and wherein said step of implanting dopants of second conductivity type through the second portion of the first insulating layer comprises implanting dopants of second conductivity type through the second portion of the first insulating layer, using the nitride spacer thereon as an implant mask.

9. The method of claim 8, wherein said step of patterning the second portion of the first insulating layer comprises etching the second portion of the first insulating layer using the nitride spacer thereon as an etching mask.

10. The method of claim 9, wherein said step of etching the second portion of the first insulating layer comprises wet etching the second portion of the first insulating layer.

11. The method of claim 9, wherein said emitter region forming step comprises forming a polycrystalline silicon emitter contact of first conductivity type in the opening in the second portion of the first insulating layer.

12. The method of claim 11, wherein said emitter region forming step comprises forming a polycrystalline silicon emitter contact of first conductivity type in the opening in the second portion of the first insulating layer and on the nitride spacer on the second portion of the first insulating layer.

13. The method of claim 11, wherein said emitter region forming step comprises diffusing first conductivity type dopants from the emitter contact into the intrinsic base region.

14. The method of claim 1, wherein said step of patterning the electrically conductive layer is preceded by the steps of forming an oxide cap having an exposed sidewall, on the electrically conductive layer; and then forming a nitride spacer on the electrically conductive layer and on the exposed sidewall of the oxide cap.

15. The method of claim 14, wherein said step of forming a nitride spacer on the exposed sidewall of the oxide cap is followed by the step of oxidizing an upper surface of the electrically conductive layer to form a thermal oxide layer thereon.

16. The method of claim 15, further comprising the step of implanting dopants of second conductivity type selectively through the thermal oxide layer but not through the oxide cap.

17. The method of claim 15, wherein said step of patterning the electrically conductive layer comprises removing the nitride spacer on the sidewall of the oxide cap and then anisotropically etching the electrically conductive layer using the oxide cap and thermal oxide layer as an etching mask.

18. The method of claim 17, wherein said step of patterning the first insulating layer comprises removing the oxide cap and underlying portion of the electrically conductive layer to expose the second portion thereof.

19. A method of forming a bipolar junction transistor, comprising the steps of:

forming a first insulating layer on a face of a semiconductor substrate containing a collector region of a first conductivity type therein, said first insulating layer having an opening therein exposing the collector region at the face;

forming an extrinsic base region contact layer of a second conductivity type on a first portion of the first insulating layer and in the opening therein;

forming an extrinsic base region of second conductivity type in the collector region, at the opening in the first insulating layer;

forming a second insulating layer on the extrinsic base region contact layer and on a second portion of the first insulating layer;

forming an intrinsic base region of second conductivity type in the collector region by implanting dopants of second conductivity type through the second portion of the first insulating layer and into the collector region; and forming an emitter region of first conductivity type in the intrinsic base region.

20. The method of claim 19, wherein said extrinsic base region forming step comprises diffusing dopants of second conductivity type from the extrinsic base region contact layer into the collector region.

21. The method of claim 19, wherein said intrinsic base region forming step is preceded by the step of forming a nitride spacer on the second insulating layer.

22. The method of claim 21, wherein said intrinsic base region forming step comprises implanting dopants of second conductivity through the second insulating layer, using the nitride spacer on the second insulating layer as an implant mask.

23. The method of claim 22, wherein said extrinsic base region contact layer forming step comprises dry etching polycrystalline silicon using the first insulating layer as an etching mask to protect the collector region.

24. The method of claim 19, wherein said extrinsic base region contact layer forming step comprises the steps of forming a layer of polycrystalline silicon on the first insulating layer and then dry etching the polycrystalline silicon layer using the second portion of the first insulating layer as an etching mask to protect a portion of the collector region.

25. A method of forming a bipolar junction transistor, comprising the steps of:

forming a first insulating layer on a face of a semiconductor substrate containing a collector region of a first conductivity type therein extending to the face, said first insulating layer having an opening therein exposing the collector region at the face;

forming an extrinsic base region contact layer of a second conductivity type on a first portion of the first insulating layer and in the opening therein;

forming an extrinsic base region of second conductivity type in the collector region, at the opening in the first insulating layer;

forming a second insulating layer on the extrinsic base region contact layer and on a second portion of the first insulating layer;

forming an intrinsic base region of second conductivity type in the collector region by implanting dopants of second conductivity type through the second portion of the first insulating layer and into the collector region; and forming an emitter region of first conductivity type in the intrinsic base region;

wherein said extrinsic base region contact layer forming step comprises the steps of forming a layer of polycrystalline silicon on the first insulating layer and then dry etching the polycrystalline silicon layer using the second portion of the first insulating layer as an etching mask to protect a portion of the collector region extending to the face.

* * * * *